(12) United States Patent
Teraoka et al.

(10) Patent No.: US 8,839,959 B2
(45) Date of Patent: Sep. 23, 2014

(54) COMPONENT SORTING AND WASTING DEVICE IN COMPONENT MOUNTING APPARATUS

(75) Inventors: Seiichi Teraoka, Chiryu (JP); Takehiro Ido, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 364 days.

(21) Appl. No.: 13/248,208

(22) Filed: Sep. 29, 2011

(65) Prior Publication Data

US 2012/0111776 A1    May 10, 2012

(30) Foreign Application Priority Data

Nov. 8, 2010  (JP) ................................. 2010-249994

(51) Int. Cl.
*B07B 1/49* (2006.01)
*H05K 13/04* (2006.01)

(52) U.S. Cl.
CPC .................. *H05K 13/0413* (2013.01)
USPC ........ 209/552; 209/556; 209/643; 414/217.1; 414/222.02; 414/223.01; 414/800

(58) Field of Classification Search
USPC ................ 209/552, 539, 556, 643, 905, 938; 414/217.01, 222.02, 223.01, 800
See application file for complete search history.

(56) References Cited

U.S. PATENT DOCUMENTS

| | | | | |
|---|---|---|---|---|
| 7,333,000 | B2 * | 2/2008 | Vassallo | 340/5.92 |
| 8,037,996 | B2 * | 10/2011 | Cheng et al. | 198/468.3 |
| 8,167,524 | B2 * | 5/2012 | Cheng et al. | 414/226.01 |
| 2010/0172734 | A1 * | 7/2010 | Cheng et al. | 414/752.1 |
| 2010/0209219 | A1 * | 8/2010 | Sze et al. | 414/222.02 |
| 2011/0197727 | A1 * | 8/2011 | In 'T Veld et al. | 83/23 |

FOREIGN PATENT DOCUMENTS

| | | |
|---|---|---|
| JP | 2004-214447 | 7/2004 |
| JP | 2008-270442 A | 11/2008 |
| JP | 2009-088570 A | 4/2009 |
| WO | WO 2009/087872 | 7/2009 |

OTHER PUBLICATIONS

Office Action issued May 13, 2014, in Japanese Patent Application No. 2010-249994, filed Nov. 8, 2010 (with English-language Translation), 5 pages.

* cited by examiner

*Primary Examiner* — Terrell Matthews
(74) *Attorney, Agent, or Firm* — Oblon, Spivak, McClelland, Maier & Neustadt, L.L.P.

(57) ABSTRACT

A component sorting and wasting device is provided with a plurality of waste boxes having respective IDs and arranged at predetermined locations for receiving components to be wasted therein and a component mounting mechanism being capable of picking up components from a component supply device in mounting the picked-up components on circuit boards and of sorting and wasting each of components which are recognized as being unable to be mounted on the circuit boards, in one of the waste boxes selected for the component to be wasted.

6 Claims, 5 Drawing Sheets

| Arrangement Location | ID of Waste Box | Waste Component |
|---|---|---|
| 1 | No. 100 | A |
| 2 | No. 200 | B |
| 3 | No. 300 | C |

COMPONENT SORTING AND WASTING DEVICE IN COMPONENT MOUNTING APPARATUS

INCORPORATION BY REFERENCE

This application is based on and claims priority under 35 U.S.C. 119 with respect to Japanese patent application No. 2010-249994 filed on Nov. 8, 2010, the entire content of which is incorporated herein by reference.

BACKGROUND OF THE INVENTION

1. Field of the Invention

The present invention relates to a component sorting and wasting device in a component mounting apparatus for sorting and wasting components which are unable to be mounted on circuit boards.

2. Discussion of the Related Art

For instance, one described in JP 2004-214447 A is known as a device for sorting and wasting electronic components which are unable to be mounted on circuit boards, on a kind-by-kind basis in a component mounting apparatus for mounting electronic components on the circuit boards.

In the device described in the Japanese application, a receiving container 164 of the shape fixed in width and extending in a lengthwise direction is arranged ahead of a table with feeders arranged thereon, in parallel to the direction in which the feeders are juxtaposed. The inner space of the receiving container 164 is partitioned by partitioning plates 166 and the like into a plurality of receiving compartments 162 having the same widths in the lengthwise direction as the feeders, and thus, components being unable to be mounted can be sorted and received in the compartments 162 on a feeder-by-feeder basis.

The device described in the Japanese application is capable of sorting the components being unable to be mounted, on the feeder-by-feeder basis and receiving the components in the plurality of receiving compartments. However, because the receiving compartments do not have respective IDs thereof, a problem arises in that the device is unable to automatically recognize waste destinations of the waste components.

SUMMARY OF THE INVENTION

Accordingly, it is an object of the present invention to provide a component sorting and wasting device in a component mounting apparatus in which device a plurality of waste boxes with respective IDs thereof are arranged at predetermined locations and which is capable of automatically recognizing the waste boxes based on the IDs and thus sorting and wasting waste components in the waste boxes.

Briefly, according to the present invention, there is provided a component sorting and wasting device in a component mounting apparatus, comprising a plurality of waste boxes having respective IDs and arranged at predetermined locations to receive components to be wasted and a component mounting mechanism configured to pick up components from a component supply device in mounting the components on circuit boards and to sort and waste components which are recognized as being unable to be mounted on the circuit boards, in the waste boxes.

With the construction, it becomes possible for the sorting and wasting device to automatically recognize the waste boxes based on the IDs, and the sorting and wasting device is able to sort and waste the waste components, which are unable to be mounted, in the waste boxes.

BRIEF DESCRIPTION OF THE ACCOMPANYING DRAWINGS

The foregoing and other objects and many of the attendant advantages of the present invention may readily be appreciated as the same becomes better understood by reference to the preferred embodiment of the present invention when considered in connection with the accompanying drawings, wherein like reference numerals designate the same or corresponding parts throughout several views, and in which.

DETAILED DESCRIPTION OF THE PREFERRED EMBODIMENT

Figure 1:
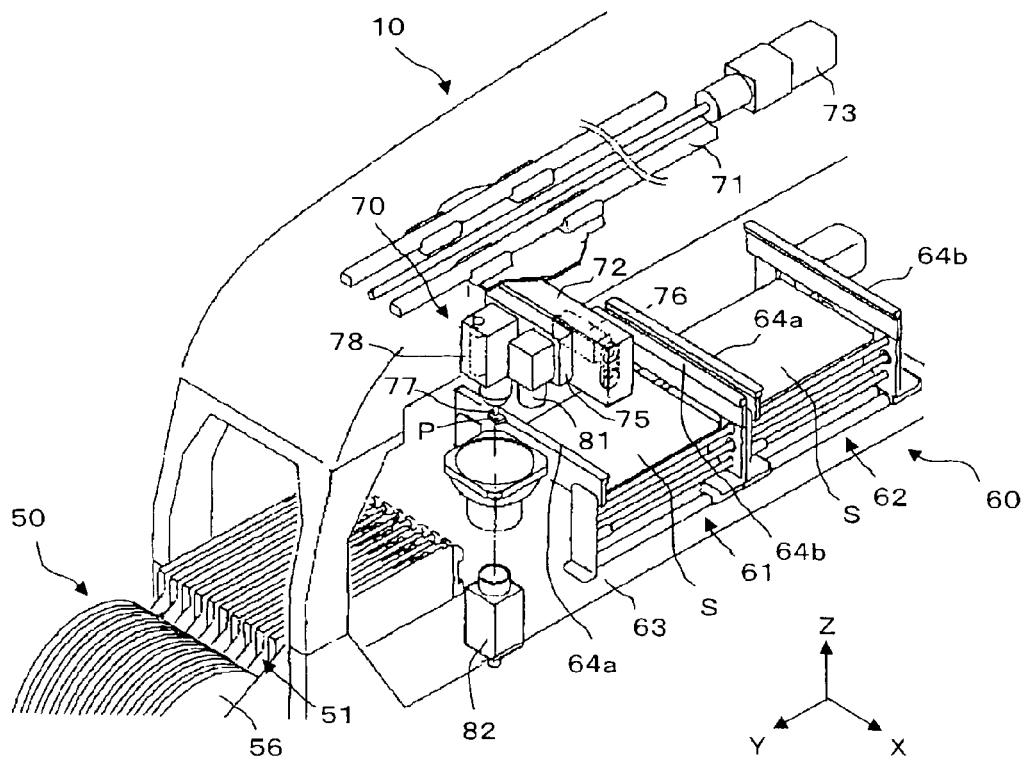
FIG. 1 is a perspective view showing a component mounting apparatus in an embodiment according to the present invention.

Hereinafter, an embodiment of the present invention will be described with reference to the drawings. As shown in FIG. 1, a component mounting apparatus 10 incorporating a component sorting and wasting device therein is provided with a component supply device 50, a board transfer device 60 and a component mounting mechanism 70.

The component supply device 50 has a feeder support table 52 (refer to FIGS. 4 and 5) attaching feeders 51 thereon. A plurality of slots 53 formed in a Y-axis direction are provided on the feeder support table 52 to be juxtaposed in an X-axis direction perpendicular to the Y-axis direction. The feeders 51 are removably attached to the slots 53 at parts thereof.

Figure 3:
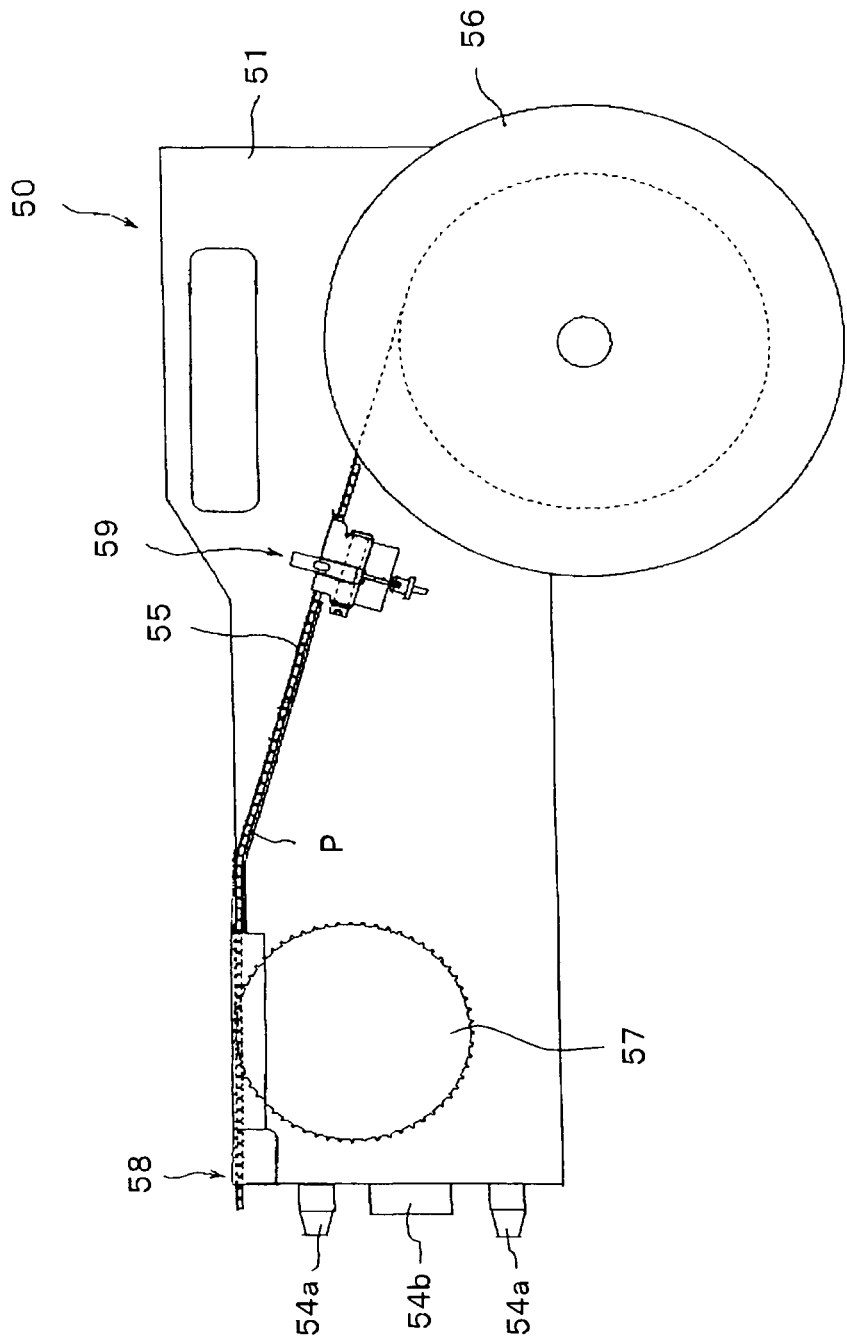
FIG. 3 is a view showing one of feeders constituting a component supply device.

As shown in FIG. 3, each feeder 51 removably attached to the feeder support table 52 comprises a tape feeder removably attaching thereto a reel 56 which winds therearound a tape 55 retaining a plurality of electronic components P with spaces therebetween. The feeder 51 rotatably supports a sprocket 57 thereon, and the sprocket 57 is driven by a motor (not shown) constituting a driving source for intermittently feeding the tape 55 through a predetermined distance (i.e., component-to-component interval). The sprocket 57 is engaged with feed holes formed on the tape 55, and the tape 55 is intermittently sent out by the rotation of the sprocket 57 through each interval. As a consequence, the electronic components P retained on the tape 55 are supplied in turn to a component supply position 58 provided at an extreme end portion of each feeder 51. Each electronic component P supplied to the component supply position 58 is picked up by being drawn to a suction nozzle of a component mounting mechanism 70 referred to later and is mounted on each circuit board S positioned at a predetermined position on the board transfer device 60.

As shown also in FIG. 3, the extreme end portion (end surface on a plug-in side) of each feeder 51 is provided with positioning pins 54a which are engageable with a pair of positioning holes 52a (refer to FIG. 5) provided on a vertical surface of the feeder support table 52, and a communication connecter 54b which is connectable with a communication connecter 52b (refer to FIG. 5) provided between the pair of positioning holes 52a on the feeder support table 52. When each feeder 51 is attached as it is slidden along each slot 53 on the feeder support table 52, the positioning pins 54a of the feeder 51 are engaged with the positioning holes 52a of the feeder support table 52, and at the same time, the communication connecter 54b of the feeder 51 is connected with the communication connecter 52b. As a result, the feeder 51 is supplied with electric power from the feeder support table 52 side, so that it is enabled to transmit control signals (component demand signal, component supply completion signal and the like) and control information such as ID and the like of each feeder 51 which are required between a control section of each feeder 51 and a control section of the feeder support table 52.

When the quantity of the remaining electronic components P retained around the reel 56 of each feeder 51 becomes small, electronic components P of the same kind can be replenished by splicing another tape. A splice sensor 59 is provided on each feeder 51 to detect a splice portion (joint portion) on the reel-wound tape 55.

The board transfer device 60 has a function of holding each circuit board S on which electronic components P are to be mounted, at a predetermined position and is configured to transfer the circuit board S in the X-axis direction. As an example, the board transfer device 60 in this embodiment is constructed as a double conveyer type with two conveyer devices 61, 62 juxtaposed in the Y-direction, as shown in FIG. 1. Each conveyer device 61, 62 takes a construction that a pair of guide rails 64a, 64b are horizontally juxtaposed on a base 63 in parallel to face each other and that a pair of conveyer belts (not shown) which support and transfer the circuit board S guided by the guide rails 64a, 64b are juxtaposed to face each other. The conveyer devices 61 and 62 are provided with respective clamp devices (not shown) which lift up and clamp the circuit boards S transferred to the predetermined positions on the conveyer devices 61 and 62, and the circuit boards S are clamped by the clamp devices at the predetermined positions on the respective conveyer devices 61, 62. Although not shown, each circuit board S is given a board ID mark indicating its ID (identification), along with a board position reference mark.

The component mounting mechanism 70 which mounts electronic components P one at a time on each circuit board S is constructed as an X-Y robot type. The X-Y robot is mounted on a ceiling portion of the base 63 to be arranged over the board transfer device 60 and the component supply device 50 and is provided with a Y-axis slide 72 which is movable along guide rails 71 in the Y-axis direction. The Y-axis slide 72 is moved in the Y-axis direction by a ball screw mechanism which has a ball screw connected to an output shaft of a Y-axis servomotor 73. An X-axis slide 75 is movably guided on the Y-axis slide 72 in the X-axis direction orthogonal to the Y-axis direction. An X-axis servomotor 76 is incorporated in the Y-axis slide 72. The X-axis slide 75 is moved in the X-axis direction by another ball screw mechanism (not shown) which is connected to an output shaft of the X-axis servomotor 76. A mounting head 78 with suction nozzles 77 each for drawing electronic components P thereto one at a time is provided on the X-axis slide 75.

The X-axis slide 75 is provided thereon with a board image pickup device 81 constituted by a CCD camera. The board image pickup device 81 picks up the images of the board position reference mark and the board ID mark which are provided on the circuit board S positioned at the predetermined position on the each conveyer device 61, 62 to obtain board position reference information and board ID information. Thus, it is possible to compensate the position in each of the X and Y directions of the mounting head 78 relative to the circuit board S based on the board position reference information obtained by the board image pickup device 81 and to control the mounting operations for electronic components P based on the board ID information obtained by the board image pickup device 81.

The base 63 is provided thereon with a component image pickup device 82 constituted by a CCD camera. The image pickup device 82 takes the image of an electronic component P drawn to a selected suction nozzle 77 of the mounting head 78 in the mid course of the mounting head 78 being moved from each component supply position 58 of the component supply device 50 to a position over the circuit board S, and detects the state of the electronic component P drawn to the suction nozzle 77, the center offset of the electronic component P relative to the axis of the suction nozzle 77, and the like. Thus, it is possible to compensate the moving amount in each of the X and Y directions and the like of the mounting head 78 based on the detected center offset and the like, so that the electronic component P can be mounted accurately at a programmed coordinate position on the circuit board S.

Figure 2:
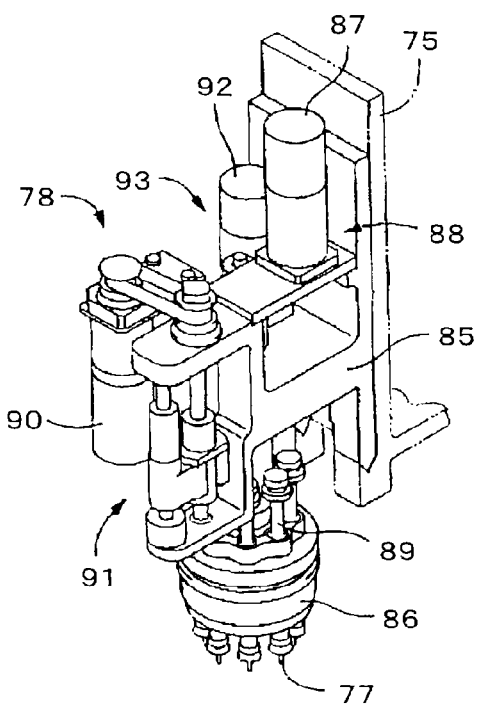
FIG. 2 is a perspective view showing a mounting head section of the component mounting apparatus.

FIG. 2 is an enlarged perspective view of the mounting head 78. The mounting head 78 has a mounting head main body 85 which is removably supported on the X-axis slide 75. A rotary holder 86 is supported on the mounting head body 85 to be intermittently rotatable and thus, is intermittently rotated by a rotational device 88 taking a motor 87 as driving source. A plurality of nozzle holders 89 are held on the circumference of the rotary holder 86 to be movable up and down. These nozzle holders 89 respectively removably hold suction nozzles 77 each for drawing an electronic component P thereto. Each nozzle holder 89 which is indexed to a fixed angular position by the intermittent rotation of the rotary holder 86 is moved up and down by a holder elevation device 91 taking a motor 90 as driving source and is able to draw an electronic component P by the indexed or selected suction nozzle 77 and to mount the drawn electronic component P on the circuit board S. In order to adjust the angular position of the electronic component P which is drawn by its own suction nozzle 77, each nozzle holder 89 having been indexed to the fixed angular position is able to be rotated about its own axis by a holder rotational device 93 taking a motor 92 as driving source.

Figure 4:
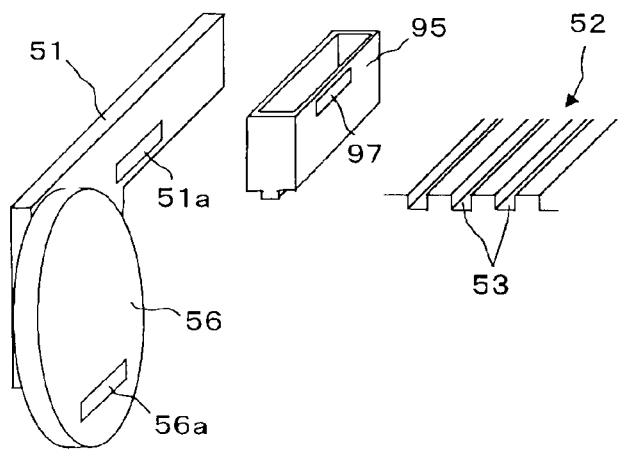
FIG. 4 is an explanatory view for explaining the manner of attaching each feeder to a feeder support table.
Figure 5:
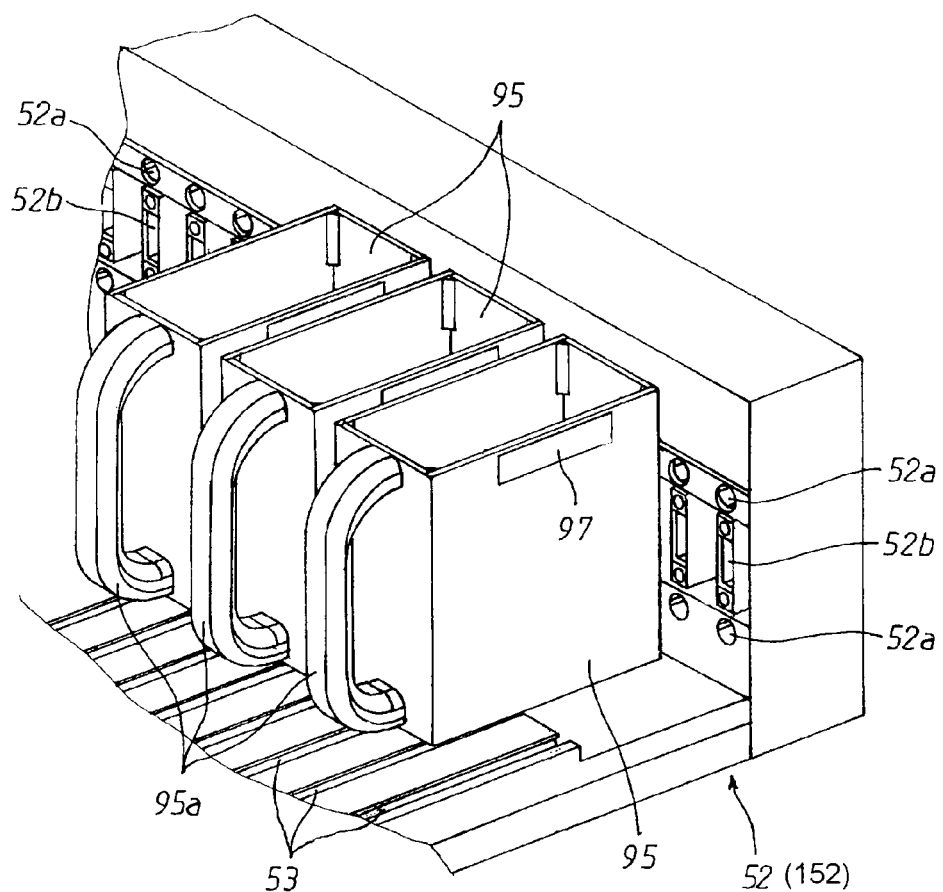
FIG. 5 is a perspective view showing waste boxes attached to the feeder support table.

As shown in FIG. 5, a plurality of waste boxes 95 are respectively removably attached at their bottom portions to the plurality of slots 53 formed on the feeder support table 52. These waste boxes 95 are provided for collecting on a kind-by-kind basis electronic components P which are unable to be mounted on the circuit board S for the reasons that for example, they have been drawn to the suction nozzles 77 in unusual position or posture. As shown in FIGS. 4 and 5, each of the waste boxes 95 is given its own identification code (ID) 97 (e.g., label, plate or the like) made of a bar code, a two-dimensional code or a code for RFID (Radio Frequency Identification) in order that the kind of each electronic component P can be identified after being wasted in each waste box 95.

Figure 6:
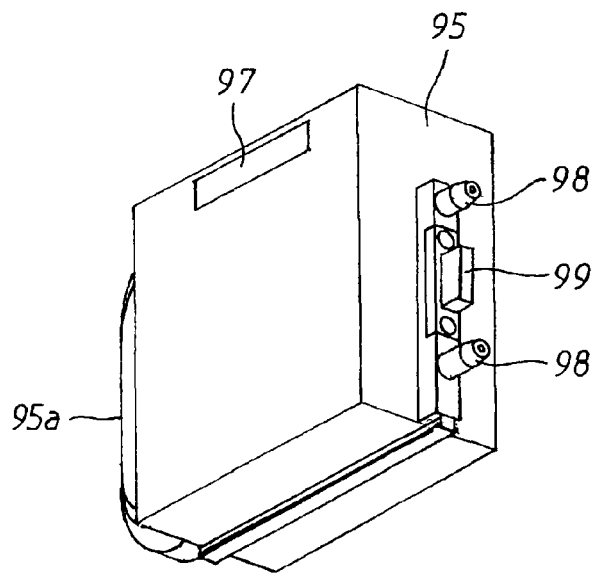
FIG. 6 is a perspective view showing an end surface of each waste box.

As shown in FIG. 6, the end surface of each waste box 95 is provided with a pair of positioning pins 98 engageable with the positioning holes 52a of the feeder support table 52 and a communication connecter 99 connectable to the communication connecter 52b of the feeder support table 52. When each waste box 95 is slidably attached to the slot 53 on the feeder support table 52, the communication connecter 99 of the waste box 95 is connected to (i.e., plugged in) the communication connector 52b of the feeder support table 52. Consequently, information indicating the box ID of each waste box 95 which has been attached to the feeder support table 52 is transmitted to the control section on the feeder support table 52 side, so that a waste box arrangement table is prepared as referred to later.

A handle 95a to be gripped by the worker is provided on a front side (worker side) of each waste box 95, so that it is easy to carry out the attaching or detaching of the waste box 95 with the feeder support table 52.

For instance, the electronic components P to be mounted on each circuit board S comprise LED (light-emitting diode) components which are identical in shape and dimension. The LED components are sorted into three kinds or ranks of A, B and C in dependence on, for example, brightness. As indicated by the waste box arrangement table in FIG. 8, LED components of rank A are to be collected in the waste box 95 with the box ID of "No. 100" for example. Likewise, LED components of rank B are to be collected in the waste box 95 with box ID of "No. 200", and LED components of rank C are to be collected in the waste box 95 with the box ID of "No. 300".

Generally, the LED components P to be mounted on the circuit boards S are limited in kind, and thus, it is often the case that some of the slots 53 on the feeder support table 52 become vacant. In this case, it is possible to utilize vacant slots 35 in attaching the waste boxes 95. Therefore, no special or extra space is required for arranging the waste boxes 95. However, the waste boxes 95 may otherwise be arranged at any other place than the feeder support table 52 (the slots 53).

Figure 7:
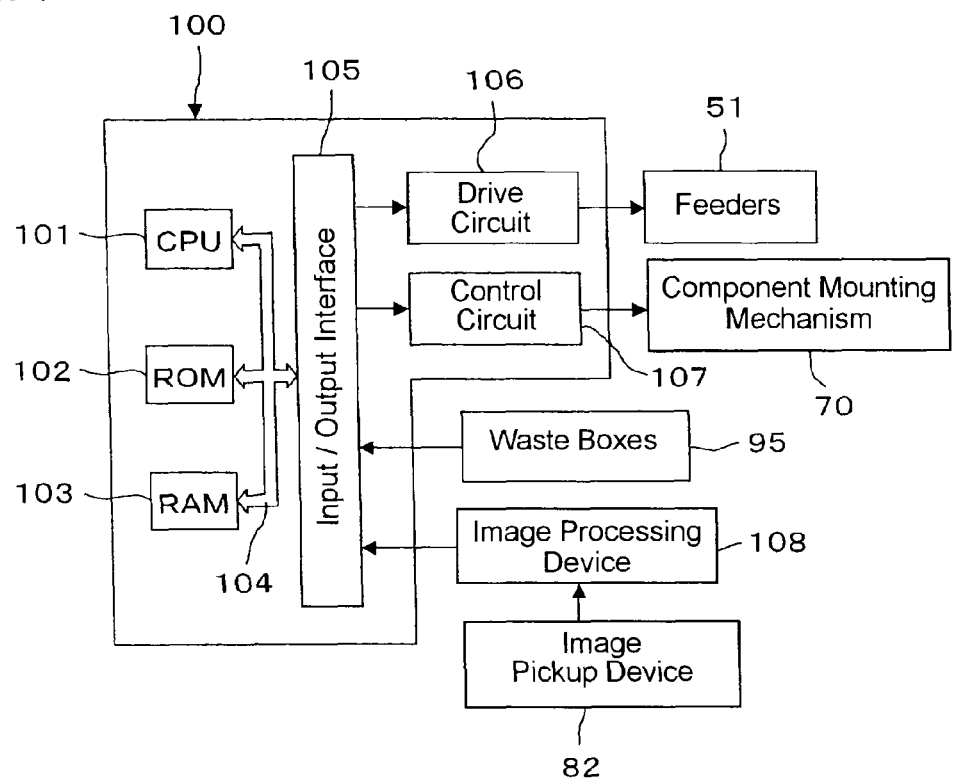
FIG. 7 is a block diagram of a control system for sorting and wasting waste components.

The component mounting mechanism 70 is controllable by a control device 100 as control means shown in FIG. 7. The control device 100 is provided with a CPU 101, a ROM 102, a RAM 103 and a bus 104 connected to them. The bus 104 is also connected to an input/output interface 105. The input/output interface 105 is connected to a drive circuit 106 which drives the feeders 51, a control circuit 107 which controls drive sections of the component mounting mechanism 70, an image processing device 108 which executes the image processing of image data taken by the component image pickup device 82, the waste boxes 95 and so on.

The ROM 102 stores therein a production program for mounting LED components (electronic components) P on each circuit board S and a sequence program for controlling sequence operations of the component mounting mechanism 70. Information regarding the production program includes component information relating to the kind and material of LED components which information is used when the LED components P are to be mounted. The sequence program also includes a waste program which responds to information regarding the state of an LED component P being drawn to the suction nozzle 77 to waste the LED component P in one of the waste boxes 95 without mounting the LED component P on the circuit board S if the drawn state is not tolerable.

The RAM 103 stores therein information regarding each circuit board S and the ID of each feeder 51 which are required in mounting LED components P of each kind on the circuit board S. The RAM 103 also stores therein the arrangement table which, as shown in FIG. 8, correlates arrangement locations where the waste boxes 95 are respectively arranged, the IDs of the waste boxes 95 arranged at these arrangement locations, and the kinds (ranks) of waste components (LED components) which are to be wasted in the waste boxes 95.

Figures 8, 9:
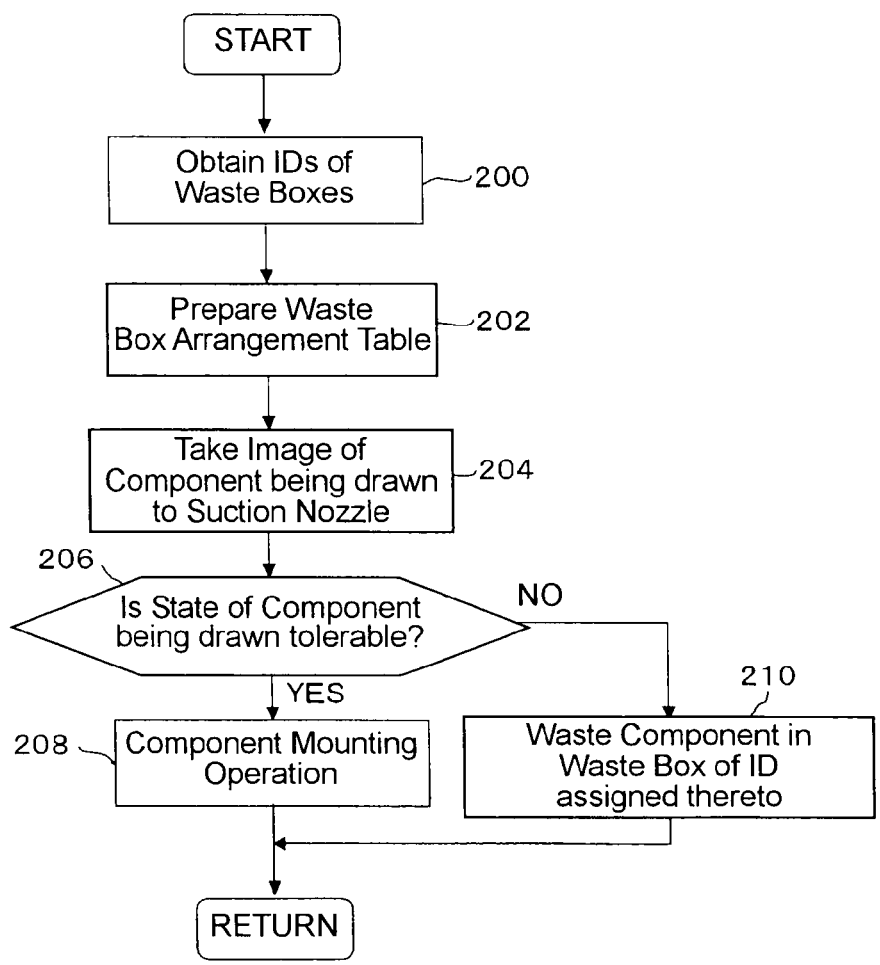
FIG. 8 is a waste box arrangement table showing a correspondence relation between IDs of the waste boxes and arrangement locations of the same.
FIG. 9 is a flow chart for sorting and wasting LED components as electronic components based on an image recognition processing.

FIG. 9 is a flow chart showing an example of a sorting and wasting operation of LED components P which is executed by the control device 100. The processing of the sorting and wasting operation will be described hereinafter.

As shown in FIG. 5, the plurality of waste boxes 95 are mounted at the fixed positions on the feeder support table 52, and the communication connecter 99 of each waste box 95 is connected with the communication connecter 52b of the feeder support table 52. At this time, at step 200, the box ID of each waste box 95 is detected through the communication connecters 99, 52b and is stored in the RAM 103 of the control device 100. At step 202, the arrangement table of the waste boxes 95 shown in FIG. 8 is prepared based on the detected box IDs of the respective waste boxes 95.

At step 204, the image of an LED component P being drawn to the selected suction nozzle 77 is taken by the component image pickup device 82 when the component P together with the selected suction nozzle 77 is moved across the axis (i.e., imaginary extension line) of the component image pickup device 82. At step 206, the image processing device 108 which processes the image data taken by the component image pickup device 82 makes a judgment of whether the state of the LED component P being drawn is correct (i.e., tolerable) or not. If the judgment is YES (i.e., the drawn state is correct or tolerable), it is possible to mount the LED component P on the circuit board S without causing any trouble. Thus, at step 208, a command is given to execute the mounting operation of the LED component P, whereby the mounting operation is carried out to mount the LED component P at a programmed or designated position on the circuit board S.

On the contrary, if the judgment is NO (i.e., the drawn state is incorrect or intolerable), the mounting on the circuit board S is judged to be unable to carry out, and the sorting and wasting processing is commanded to sort and waste the LED component P in the waste box 95 with the ID assigned to the kind of the LED component P (step 210).

Consequently, the mounting head 78 with the LED component P drawn and held thereto is positioned over the waste box 95 of the box ID corresponding to the kind of the component P. More specifically, as shown by the arrangement table in FIG. 8, where an LED component P of rank A is to be wasted, the mounting head 78 with the LED component P is positioned over the waste box 95 whose box ID is "No. 100". Likewise, where an LED component P of rank B is to be wasted, the mounting head 78 with the LED component P is positioned over the waste box 95 whose box ID is "No. 200". Over the waste box 95 selected in dependence on the rank of the LED component P to be wasted, the mounting head 78 releases the LED component P from the suction nozzle 77, whereby the LED component P is sorted and wasted in the waste box 95 selected therefor.

When the LED components P sorted and wasted in each waste box 95 are to be withdrawn for reuse, each such waste box 95 is detached from the slot 53 on the feeder support table 52. As mentioned earlier, the identification codes 97 (box IDs) are given by, e.g., being affixed to the respective waste boxes 95. Thus, at this time, even after each waste box 95 is taken away from the fixed position on the feeder support table 52, the kind of the LED components P contained in each of the detached waste boxes 95 can easily be discriminated based on the ID 97 given to the waste box 95.

According to the aforementioned embodiment, the plurality of waste boxes 95 with the respective IDs are detachably attached to the vacant slots 53 on the feeder support table 52 attaching the feeders 51 thereto. Therefore, it is realized to arrange the waste boxes 95 by the effective use of the vacant slots 53, so that a special or extra space to arrange the waste boxes 95 becomes unnecessary.

Further, the waste boxes 95 are attached to the slots 53 of the feeder support table 52 to be able to communicate with the control device 100 through the connecter sections (communication connecters 99, 52b) which are common to the waste boxes 95 and the feeders 51. Thus, the IDs of the waste boxes 95 can be obtained by utilizing the communication sections 52b which are provided on the feeder support table 52 for communication with the feeders 51, so that each waste component 95 which became unable to be mounted can be put automatically in one of the waste boxes 95 which is selected in dependence on the rank of each such waste component 95.

In the aforementioned embodiment, an example has been described wherein the plurality of waste boxes 95 are attached to the slots 53 on the feeder support table 52 mounting the feeders 51 thereon. However, the present invention is not intended to particularly limit the arrangement positions of the waste boxes 95. In a modified form, for instance, the waste boxes 95 may be arranged on a tray-type pallet for the component supply device 50. This can be realized by using a pallet 152 indicated at FIG. 5 in substitution for the feeder support table 52.

In the aforementioned embodiment, an example has been described wherein the LED components are sorted and wasted according to the ranks of brightness. However, the present invention is not limited to sorting and wasting the LED components. In a further modified form, for instance, components to be sorted and wasted may be sorted and wasted in dependence on whether they are rare material, expensive material (e.g., gold-plated components, components containing rare metal or rare earth), or not. Further, it is possible to sort and waste components in terms of sortation in waste processing such as, for example, sorting the components into those to be buried, those to be incinerated and those to be recycled. In this point of view, for instance, the waste boxes 95 are sorted in terms of gold, rare metal and the like for the purpose of recycling, in terms of ranked LED components or the like for the purpose of reuse, or in terms of those to be buried and those to be incinerated for the purpose of wasting. This can be realized by giving the waste boxes 95 respective IDs that enable the sortation of such various kinds to be recognized.

In the aforementioned embodiment, the waste boxes 95 are provided with the communication connecters 99 and are arranged at the predetermined locations, so that the control device 100 can obtain the identification codes (box IDs) 97 of the waste boxes 95 through the communication connecters 99, 52b. In a modified form, a bar code reader or the like may be provided to read the IDs (identification codes) 97 of the waste boxes 95, and the correspondence relation between the box IDs so read and the arrangement locations of the waste boxes 95 may be rewritably stored in the RAM 103 of the control device 100.

Various features and many of the attendant advantages in the foregoing embodiment will be summarized as follows:

In the component sorting and wasting device in the foregoing embodiment typically shown in FIGS. 5 and 9, it becomes possible for the device to automatically recognize the waste boxes 95 based on the IDs 97, and the device is able to sort and waste the waste components which are unable to be mounted, in the waste boxes 95.

In the component sorting and wasting device in the foregoing embodiment typically shown in FIGS. 6 and 7, each waste box 95 has the communication section (communication connecter) 99 which is able to communicate with the control device 100. Thus, the control device 100 is able to acquire the ID of each waste box 95 through the communication section 99 of the same.

In the component sorting and wasting device in the foregoing embodiment typically shown in FIGS. 7 and 8, the IDs of the waste boxes 95 are rewritable. Thus, by rewriting the corresponding relation between the IDs of the waste boxes 95 and the waste components, it is realized to waste components which are different in kind from those before the rewriting, in the same waste box 95.

In the component sorting and wasting device in the foregoing embodiment typically shown in FIGS. 1 and 3, the components P comprise the LED components, and the LED components are sorted in advance into the plurality of ranks. Thus, the LED components P being unable to be mounted on the circuit boards S can be sorted and wasted in dependence on brightness, color or the like, and it is easily done to reuse the LED components P.

In the component sorting and wasting device in the foregoing embodiment typically shown in FIGS. 1 and 3-5, the component supply device 50 has the feeders 51 each retaining the plurality of components P for supplying each component P to the fixed supply position 58. The feeders 51 are removably mounted to some of the slots 53 provided on the feeder support table 52. The waste boxes 95 are removably mounted to the remainder or others of the slots 53 which are not occupied by the feeders 51. Thus, the slots 53 of the feeder support table 52 can be effectively utilized, and any special or extra space which would otherwise be required to arrange the waste boxes 95 becomes unnecessary.

In the component sorting and wasting device in the foregoing embodiment typically shown in FIGS. 5-7 and 9, the waste boxes 95 are mounted to the remainder or others of the slots 53 to be able to communicate with the control devices 100 through the communication sections 52b which are common to the feeders 51 and the waste boxes 95. Thus, it is possible to acquire the IDs of the waste boxes 95 by utilizing the communication sections 52b which are provided on the feeder support table 52 for communication with the feeders 51.

In the component sorting and wasting device in the foregoing embodiment, the component supply device 50 has a tray (152 in FIG. 5) containing the plurality of components. The component sorting and wasting device in the foregoing embodiment can be applied to the component mounting apparatus which is provided with the component supply device 50 having the tray 152 containing the plurality of components.

INDUSTRIAL APPLICABILITY

A component sorting and wasting device in a component mounting apparatus according to the present invention is suitable for use in a device which sorts and wastes components which are unable to be mounted on circuit boards, in a plurality of waste boxes.

Obviously, numerous further modifications and variations of the present invention are possible in light of the above teachings. It is therefore to be understood that within the scope of the appended claims, the present invention may be practiced otherwise than as specifically described herein.

What is claimed is:

1. A component sorting and wasting device in a component mounting apparatus, comprising:

a plurality of waste boxes having respective IDs and arranged at predetermined locations to receive components to be wasted; and a component mounting mechanism configured to pick up components from a component supply device in mounting the components on circuit boards and to sort and waste components which are recognized as being unable to be mounted on the circuit boards, in the waste boxes, wherein the ID of each waste box is rewritable.

2. The component sorting and wasting device according to claim 1, wherein each of the waste boxes has a communication section which is able to communicate with a control device.

3. The component sorting and wasting device according to claim 1, wherein the components comprise LED components and wherein the LED components are sorted into a plurality of ranks in advance.

4. The component sorting and wasting device according to claim 1, wherein:

the component supply device has feeders each retaining a plurality of components for supplying each of the components to a supply position;

the feeders are removably attached to some of slots provided on a feeder support table; and the waste boxes are removably attached to others of the slots.

5. The component sorting and wasting device according to claim 4, wherein the waste boxes are attached to the others of the slots to be able to communicate with a control device through communication sections common to the feeders and the waste boxes.

6. The component sorting and wasting device according to claim 1, wherein the component supply device has a tray retaining the plurality of components.

* * * * *